United States Patent [19]

Harris et al.

[11] Patent Number: 5,037,902

[45] Date of Patent: Aug. 6, 1991

[54] MISCIBLE BLENDS OF IMIDE CONTAINING POLYMERS WITH POLY(ARYL SULFONES)

[75] Inventors: James E. Harris, Evans, Ga.; Gary T. Brooks, Naperville, Ill.

[73] Assignee: Amoco Corporation, Chicago, Ill.

[21] Appl. No.: 291,967

[22] Filed: Dec. 30, 1988

[51] Int. Cl.$^5$ ............................................. C08L 79/08
[52] U.S. Cl. ...................................... 525/436; 525/906
[58] Field of Search .............................. 525/436, 906

[56] References Cited

U.S. PATENT DOCUMENTS

| | | | |
|---|---|---|---|
| 3,634,355 | 1/1972 | Barr et al. | 260/49 |
| 4,008,203 | 2/1977 | Jones | 260/49 |
| 4,108,837 | 8/1978 | Johnson et al. | 528/126 |
| 4,175,175 | 11/1979 | Johnson et al. | 528/125 |
| 4,293,670 | 10/1981 | Robeson et al. | 525/436 |
| 4,371,672 | 2/1983 | Younes | 525/391 |
| 4,684,674 | 8/1987 | Brooks | 523/205 |
| 4,713,426 | 12/1987 | Harris et al. | 525/471 |
| 4,713,438 | 12/1987 | Harris et al. | 528/337 |

FOREIGN PATENT DOCUMENTS 8303417 10/1983 European Pat. Off. ............ 525/436
59-122547 7/1984 Japan .

Primary Examiner—Ana L. Carrillo
Attorney, Agent, or Firm—Morgan & Finnegan

[57] ABSTRACT

This application relates to miscible blends of biphenyl containing poly(aryl sulfones) and isopropylidene based polyimides. These blends are suitable for printed wiring board substrates, flexible printed circuit boards, electrical connectors and fabricated articles requiring heat and chemical resistance. A method for extruding these articles is taught.

13 Claims, No Drawings

MISCIBLE BLENDS OF IMIDE CONTAINING POLYMERS WITH POLY(ARYL SULFONES)

FIELD OF THE INVENTION

Applicants teach about unique combinations of select imide containing polymers that contain an isopropylidene group which are miscible with biphenyl containing polysulfones, and processes for using such combinations. These blends are suitable for printed wiring board substrates, flexible printed circuit boards, electrical connectors and other fabricated articles requiring high heat and chemical resistance, and good dimensional and hydrolytic stability. They are particularly suitable for use as matrix resins in thermoplastic continuous fiber composites.

BACKGROUND OF THE INVENTION

Applicants have directed their attention to making miscible blends of polymers having utility as composite matrices for advanced composite aerospace uses and for use as general purpose injection molding resins. Rather than directing attention to miscible thermoplastic blends, the prio art has been directed to blends of thermoplastics without regard to whether or not they are miscible.

U.S. Pat. No. 4,293,670 to Robeson et al describes molding compositions of blends of poly(aryl ether) resin and polyetherimide resin. The poly(aryl ether) resin is taught t be a linear, thermoplastic polyarylene polyether wherein the arylene units are interspersed with ether, sulfone or ketone linkages. Particular formulae of polyetherimides are taught the reference. A molding composition comprising blends of these materials is claimed and exemplified in the reference.

U.S. Pat. No. 4,713,426 describes blends of a biphenyl containing poly(aryl ether sulfone) and a poly(aryl ether ketone). The reference teaches that these blends have limited miscibility and excellent mechanical compatibility. According to the reference, these blends possess, in an article molded therefrom, a good balance of properties including higher modulus, impact resistance, solvent resistance and resistance to environmental stress cracking. As taught, the poly(aryl ether ketones) are used because they offer an exceptional balance of properties, namely, high melting point, excellent thermal stability, excellent hydrolytic stability, high stiffness and strength, good toughness, and excellent solvent and environmental stress rupture resistance. The reference specifically teaches that the results indicate that a low level of miscibility is observed in these blends as the glass transition temperature of the poly(aryl ether sulfone) is slightly decreased. However, the blend contains separate glass transition temperatures for each of the components of the blends.

U.S. Pat. No. 4,684,674 to Brooks teaches another blend. Specifically, the reference teaches polyamide-imide copolymers and polyamide-imide-imidephthalamide copolymers containing aromatic sulfone polymers. However, the blends are two-phase and exemplified by two glass transition temperatures, one for each of the components of the blend. The reference teaches that a completelY.miscible system exhibits a single glass transition temperature (T$_g$) while immiscible blends have two T$_g$'s, each at the temperature of one of the components. The reference specifically teaches that the polyamide imide/polyethersulfone blends taught in the reference show no evidence of a system which is miscible.

World Patent Application No. WO 8604-079A describes blends of phenylindane containing polyimides with polyetherimides, polysulfones, polyarylether ketones, polycarbonates, polyarylates or polyphenylene oxides. The compositions are claimed to be useful as adhesives, coatings or matrix resins in carbon fiber reinforced composites.

In the field of miscibility or compatibility of polymer blends, the prior art has found predictability to be unattainable, even though considerable work on the matter has been done. According to the authorities:

(A) "It is well known that compatible polymer blends are rare". Wang and Cooper, Journal of Polymer Science, Polymer Physics Edition, Vol. 21, p. 11 (1983).

(B) "Miscibility in polymer-polymer blends is a subject of widespread theoretical as well as practical interest currently. In the past decade or so, the number of blend systems that are known to be miscible has increased considerably. Moreover, a number of systems have been found that exhibit upper and lower critical solution temperatures, i.e., complete miscibility only in limited temperature ranges. Modern thermodynamic theories have had limited success to date in predicting miscibility behavior in detail. These limitations have spawned a degree of pessimism regarding the likelihood that any practical theory can be developed that can accommodate the real complexities that nature has bestowed on polymer-polymer interactions." Kambour, Bendler, Bopp, Macromolecules, 16, 753 (1983).

(C) "The vast majority of polymer pairs form two-phase blends after mixing as can be surmised from the small entropy of mixing for very large molecules. These blends are generally characterized by opacity, distinct thermal transitions, and poor mechanical properties. However, special precautions in the preparation of two-phase blends can yield composites with superior mechanical properties. These materials play a major role in tho polymer industry, in several instances commanding a larger market than either of the pure components." Olabisi, Robeson, and Shaw, Polymer-Polymer Miscibility, Academic Press, New York, N.Y., p. 7 (1979).

(D) "It is well known that, regarding the mixing of thermoplastic polymers, incompatibility is the rule and miscibility and even partial miscibility is the exception. Since most thermoplastic polymers are immiscible in other thermoplastic polymers, the discovery of a homogeneous mixture or partially miscible mixture of two or more thermoplastic polymers, is, indeed, ihherently for example, see P. J. Flory, Principles of Polymer Chemistry, Cornell University Press, 1953, Chapter 13, p. 555." Younes, U.S. Pat. No. 4,371,672.

(E) "The study of polymer blends has assumed an ever increasing importance in recent years and the resulting research effort has led to the discovery of a number of miscible polymer combinations. Complete miscibility is an unusual property in binary polymer mixtures which normally tend to form phase-separated systems. Much of the work has been of a qualitative nature, however, and variables such as molecular weight and conditions of blend preparation have often been overlooked. The criteria for establishing miscibility are also varied and may not always all be applicable to particular systems." Saeki, Cowie and McEwen, Polymer, vol. 25, p. 60 (January 1983).

Thus, miscible or compatible polymer blends are not common. The criteria for determining whether or not two polymers are miscible are now well established. According to Olabisi, et al., Polymer-Polymer Miscibility, supra p. 120:

"The most commonly used method for establishing miscibility in polymer-polymer blends or partial phase mixing in such blends is through determination of the glass transition (or transitions) in the blend versus those of the unblended constituents. A miscible polymer blend will exhibit a single glass transition between the Tg,s of the components with a sharpness of the transition similar to that of the components. In cases of borderline miscibility, broadening of the transition will occur. With cases of limited miscibility, two separate transitions between those of the constituents may result, depicting a component 1-rich phase and a component 2-rich phase. In cases where strong specific interactions occur, the Tg may go through a maximum as a function of the concentration. The basic limitation of the utility of glass transition determinations in ascertaining polymer-polymer miscibility exists with blends composed of components which have equal or similar (20° C difference) Tg,s, whereby resolution by the techniques to be discussed of two Tg,s is not possible."

W. J. MacKnight et al., in Polymer Blends, D. R. Paul and S. Newman, p. 188, Academic press, New York, NY. (1978) state:

"Perhaps the most unanbiguous criterion of polymer compatibility is the detection of a single glass transition whose temperature is intermediate between those corresponding to the two component polymers."

In this passage, it is clear that by compatibility the authors mean miscibility, i.e., single phase behavior. See, for example, the discussion in Chapter 1 by D.R. Paul in the same work. The above references and related application are hereby incorporated by reference.

However, the miscible blends disclosed in this application are one phase based on them having a single glass transition temperature giving the resulting blends improved chemical resistance compared to the immiscible multiphase blends having similar constituents. Further, the miscible blends show improved thermal and optical performance over immiscible blends. This is attributable to discovering that select imide containing polymers having an isopropylidene group are miscible with biphenyl containing polysulfones. Herein, the term "poly-imide" refers to polymers containing the following linkage:

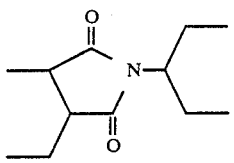

or mer unit.

SUMMARY OF THE INVENTION

This invention relates to a miscible blend of a poly(aryl sulfone) and a polyimide or amide-imide comprising:
(a) poly(aryl sulfone) containing the following unit:

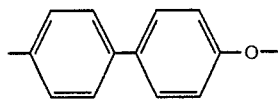

and (b) polyimide or amide-imide containing the following unit:

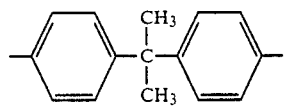

This invention also relates to a process for producing a miscible blend of biphenyl containing poly(aryl sulfone), and isopropylidene and imide containing polymer comprising adding the monomers used to form the latter polymer to the poly(aryl sulfone) in a vented extruder.

This invention further relates to a polyimide of the following formula:

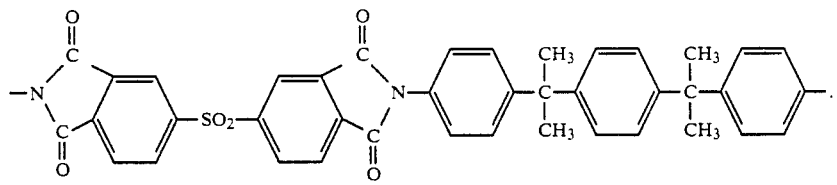

DETAILED DESCRIPTION OF THE INVENTION

Applicants disclose a method of improving the flow of polyimides (PI) and amide-imides (PAI) while at the same time improving the chemical resistance of poly(aryl sulfones) (PAS) by alloying the two polymers together. A major factor limiting the applicability of the alloying approach is that the majority of polymer alloys are not miscible. That is, the alloys are two-phase; and the continuous phase is usually the lower viscosity component. Thus, immiscible blends will likely be a poly(aryl sulfone) filled with the polyimide or amide-imide component as inclusions. Such a morphology generally results in an improvement in flow (e.g. reduced viscosity). However, the chemical resistance of such an alloy will be closer to that of the continuous phase than to the inclusions and may be expected to be poor. Additionally, in the event the $T_g$s of the two components are significantly different, the upper use temperature of the alloy will not be significantly higher than that of the lower $T_g$ constituent. In the case of continuous fiber composites wherein the alloy is the matrix resin, the reason for this is that a high matrix modulus is necossary to prevent buckling of carbon fibers when a composite is loaded in compression. An immiscible blend has two $T_g$s (usually near those of the constituents); and at each $T_g$, the matrix modulus drops significantly. If such a blend is used as the composite matrix, then the useful temperature range of the composite is limited to the lower $T_g$.

It has been discovered unexpectedly that a select group of poly(aryl sulfones) is miscible with a select group of polyimides and amide-imides. The poly(aryl sulfone) must contain biphenyl linkages while the polyimides or amide-imides must contain isopropylidene linkages. These blends show markedly improved chemical resistance and a single $T_g$ intermediate to those of the constituents resulting from their miscible character. Thus, the upper use temperature of the alloy may be significantly improved over that of the lower $T_g$ constituent. Further, by reducing the $T_g$ of the higher $T_g$ constituent, it is typically more processable. As a consequence of this, these alloys can be used as injection moldable thermoplastic materials having improved flow and toughness characteristics as well as better chemical resistance.

The components of the miscible blend of imide containing polymers with poly(aryl sulfones) will be discussed below. Also to be discussed is the need or criticality of the mixture to exhibit a negative miscibility factor.

The poly(aryl sulfone)s which are suitable for use in the invention contain at least one biphenyl unit in the structure. The presence of the biphenyl unit in the poly(aryl sulfone) is critical to obtain miscibility between the poly(aryl sulfone) and the polyimide.

Poly(aryl sulfone) polymers are characterized by inherently high heat distortion temperatures, excellent dimensional stability, creep resistance, lowloss AC dielectric properties, and high mechanical strength as shown below.

| Typical Properties of Poly(aryl sulfone) Resins | | |
|---|---|---|
| | Units | Typical Range |
| Property | | |
| Tensile Strength | psi | 12,500–15,000 |
| Elongation to Break | % | >40 |

| Typical Properties of Poly(aryl sulfone) Resins | | |
|---|---|---|
| | Units | Typical Range |
| Tensile Modulus | psi | 300–400,000 |
| Flexural Strength | psi | 13,000–20,000 |
| Heat Deflection Temperature | °C. | 170–250 |
| Density | gm/cc | 1.2–1.4 |
| AC Dielectrics | | |
| Dielectric Constant | | |
| 60 HZ | — | 3.0–4.0 |
| 1 KHZ | — | 3.0–4.0 |
| 1 MHZ | — | 3.0–3.5 |
| Dissipation Factor | | |
| 60 Hz | — | 0.0005–0.005 |
| 1 KHZ | — | 0.0005–0.003 |
| 1 MHZ | — | 0.004–0.01 |
| Dielectric Strength ⅛" specimen | Volts/mil | 350–550 |

Poly(aryl sulfone) polymers are easilyprocessed utilizing standard injection moldingmachineryadn practice. Prior to molding, resins should be dried to obtain optimum performance ina dehumidified hopper drier or circulating air oven.

The rheological characeristics of poly(aryl sulfone) polymers provide excellent flow for filling thin and intricate wall sections typically encountered in injection molding. The polymers process readily at stock temperatures in the 550°–750° F range. Mold temperatures of 150°–400° F are typically used The poly(aryl sulfone) may be random or may have an ordered structure. The poly(aryl sulfone)s, which are suitable for use in this invention, contain at least one biphenyl unit in the repeat unit. The preferred biphenyl containing poly(aryl sulfone) contains the repeating unit:

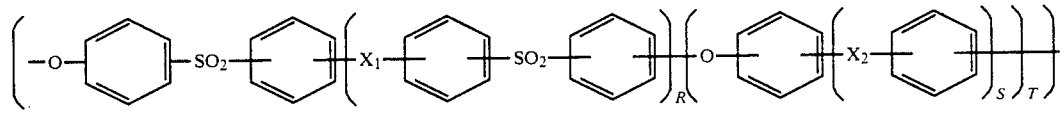

where $X_1$ and $X_2$ are independently —O—,

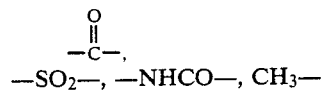

—SO$_2$—, —NHCO—, CH$_3$— or a direct bond with the proviso that at least one of $X_1$ or $X_2$ is a direct bond, and R, S and T are independently 0 or 1; with the proviso that at least one of R or S is 1.

The preferred poly(aryl sulfones) include those having the following reoccurring units:

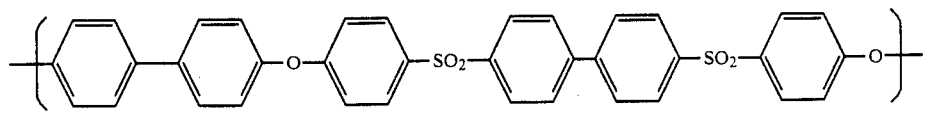

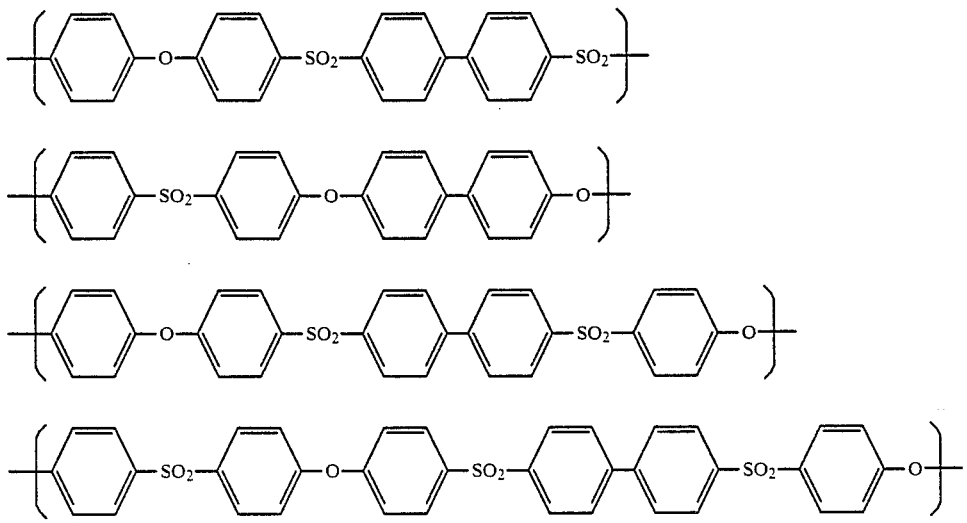

Examples of commercially available biphenyl containing poly(aryl sulfones) are the polymers known as Radel R and Radel C sold by Amoco Performance Products, Inc. of Ridgefield, Connecticut.

The poly(aryl sulfone)s are produced by methods well known in the art such as those described in U.S. Pat. Nos. 3,634,355; 4,008,203; 4,108,837 and 4,175,175, hereby incorporated by reference.

The preferred method of preparation, herein referred to as method A, involves the reaction of a dihydric phenol sith a dihalobenzenoid compound in substantially equal molar amounts in a mixture of alkali metal carbonates and an aprotic solvent. The ratio of reactive halogen groups in the dihalobenzenoid compound to hydroxyl groups in the dihydric phenol is preferably from 0.98 to 1.02. Preferred dihalobenzenoid compounds include 4,4'dichlorodiphenylsulfone (DCDPS) and 4,4'-Bis[(4-chlorophenylsulfonyl)] 1,1'-biphenyl (BCPSB). Preferred dihydric phenols include 4,4'-dihydroxybiphenyl (BP), 4,4'-dihydroxydiphenylsulfone (Bis-S), 1,4-dihydroxybenzene (HQ), and Bis(4-hydroxyphenyl] 1-methylethylidene (Bis A).

The poly(aryl sulfones) are prepared by contacting substantially equimolar amounts of the dihydric phenols and dihalobenzenoid compounds with from about 0.5 to 1.0 mole of an alkali metal carbonate per mole of hydroxyl group in a solvent mixture comprising a solvent which forms an azeotrope with water to maintain the reaction medium at substantially anhydrous conditions during polymerization.

The reaction of the mixture is kept at from about 120° to about 180° C for about 1 to 5 hours, then raised and kept at about 200° to 250° C for about 1 to 10 hours. The reaction is carried out in an inert atmosphere, e.g., nitrogen, at atmospheric pressure. The poly(aryl sulfone) may be recovered by conventional techniques such as coagulation, solvent evaporation, and the like. The resultant polymers have reduced viscosities in the range from 0.4 to 1.5 dl/g, as measured in N-methylpyrolidone at 25° C.

The other component of the blend is a polyimide or amide-imide that contains an isopropylidene group. The isopropylidene group is critical to the miscibility of the .. blend constituents of this invention. Polyimides or amideimides are characterized by the presence of the phthalimide structure in the polymer backbone:

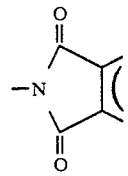

Polyimides are very rigid polymers which sometimes lack the inherent toughness needed to compete in those uses which require elevated temperature resistance and good impact strength. The lack of matrix toughness can cause problems when molding thick cross-sectional parts. The art has been looking for improvements in the impact resistance and toughness of these polymers but it is essential that the additive not significantly impair their thermal and strength properties, particularly their heat deflection temperatures, tensile strengths, and chemical resistances.

The polyimides which are suitable for use in this invention comprise those containing the following repeating units;

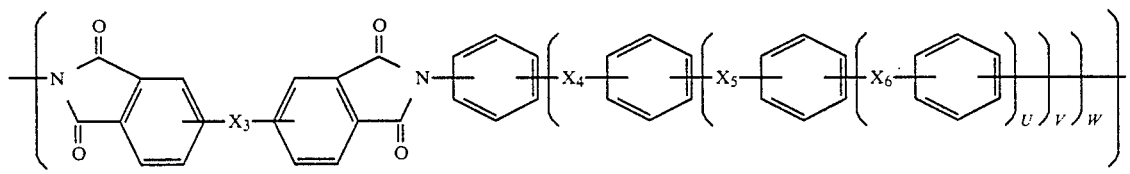

wherein $X_3$, $X_4$, $X_5$ and $X_6$ are independently —O—

The polyamide-imides which are suitable for use in this invention comprise those containing the following repeating units:

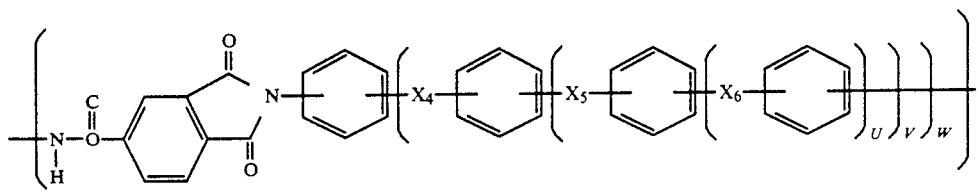

wherein $X_4$, $X_5$, $X_6$, U, V and W are as defined above.

$$-SO_2-, -NHCO-, -\overset{O}{\underset{}{\overset{\|}{C}}}-,$$

The preferred polyimides comprise those having the following recurring units:

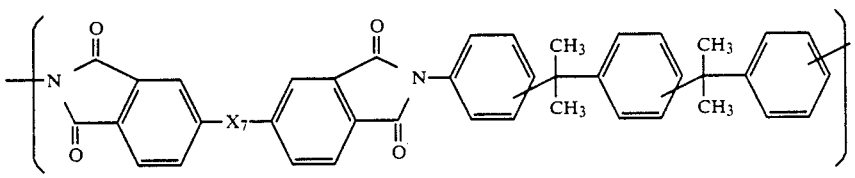

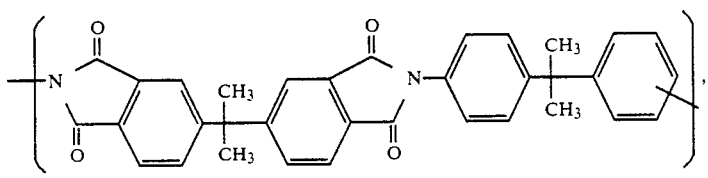

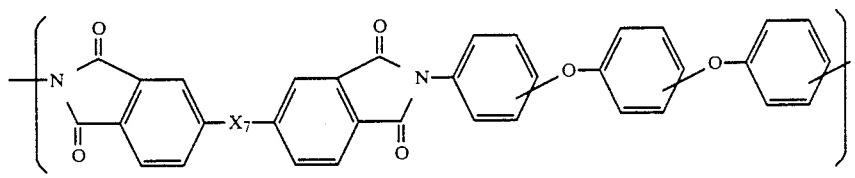

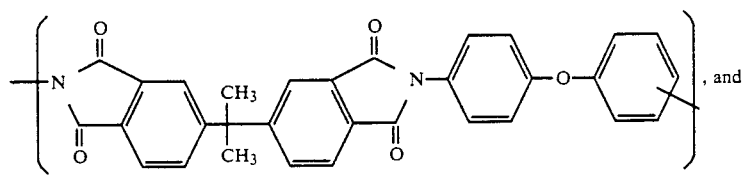

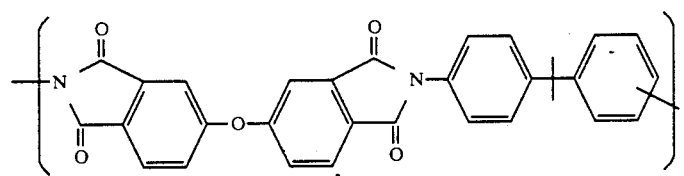

wherein $X_7$ can be $$-\underset{CH_3}{\overset{CH_3}{\underset{|}{\overset{|}{C}}}}-, \quad -\overset{O}{\underset{}{\overset{\|}{C}}}-, \quad -SO_2-, \quad -\underset{CH_3}{\overset{CH_3}{\underset{|}{\overset{|}{C}}}}-, \quad -O-$$

or a direct bond with the proviso that at least one is isopropylidene; and U, V and W are independently 0 or 1 with the proviso that at least one of U or V is 1.

or a direct bond.

The preferred polyamide-imides also comprise those having the following recurring units:

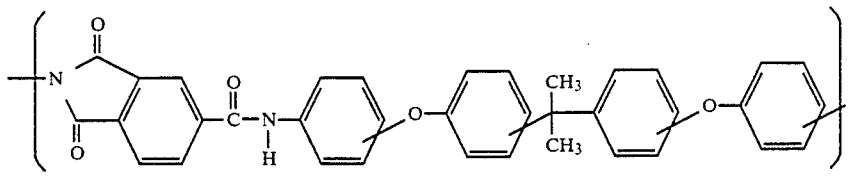

and

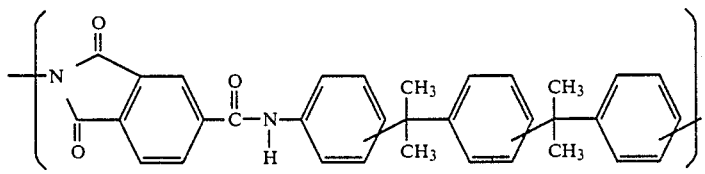

The polyimides of this invention may be made by methods well known in the art such as those described in U.S. Pat. No. 4,713,438, hereby incorporated by reference. They are preferably prepared by the reaction of a dianhydride (or mixture of dianhydrides) with a diamine (or mixture of diamines) in substantially equimolar amounts in a solvent followed by chemical dehydration of the intermediate poly(amide-acid), hereafter referred to as Method B. Preferred dianhydrides include 1,2,4,5-benzene tetracarboxylic anhydride (PMDA), bis(4-phthalic anhydride) 1-methylethylidene (IPAN), 3,3',4,4,-biphenyltetracarboxylic anhydride (BPDA), 3,3',4,4'-diphenylether tetracarboxylic anhydride (OPAN) and 3,3',4,4'-benzophenone tetracarboxylic anhydride (BTDA). Preferred diamines include 4,4,-(1-methylethylidene)bisaniline (BAA), 4,4'(BAP), bis(4-amino phenoxy-4-phenyl) 1-methylethylidene (BAPP), 4,4,-diaminodiphenylether (OBA), and 1,3,-diaminobenzene (MPD).

The solvents useful in the solution polymerization process for synthesizing the polyamide-acid compositions are the organic solvents whose functional groups do not react with either of the reactants (the diamines or the dianhydrides) to any appreciable extent. In addition to being inert to the system, and preferably, being a solvent for the polyamide-acid, the organic solvent must be a solvent for at least one of the reactants, preferably for both of the reactants. The normally liquid organic solvents of the N,N-dialkylcarboxylamide class are useful as solvents in the process. The preferred solvents are the lower molecular weight members of this class, particularly N,N-dimethylformamide and N,N-diethylacetamide. Other useful solvents are N,N-diethylformamide, N,N-diethylacetamide, N,N-dimethylmethoxyacetamide, N-methyl caprolactam, and the like. Other solvents which may be used include dimethylsulfoxide, N-methyl-2-pyrrolidone, tetramethyl urea, pyridine, dimethylsulfone, hexamethyl-phosphoramide, tetramethylene sulfone, formamide, N-methyl-formamide, butyrolactone and phenols such as m-cresol. The solvents can be used alone, in combinations, or in combination with poorer solvents such as benzene, benzonitrile, dioxane, xylene, toluene and cyclohexane.

Another group of solvents that are very useful for the preparation of polyimides as well as of poly(amide-imides) are the diaryl sulfones and diaryl ketones; they may be used alone or in combination with other solvents such as the hydrocarbons, chlorinated hydrocarbons, etc. Typical representatives are diphenyl sulfone and benzophenone. These solvents are of interest because they allow for the use of high temperatures and are, therefore, adequate in cases where the amine reaction reactivity is low; or in cases where low solubility of the polymer is encountered. In both instances, use of higher reaction temperatures may be necessary. Also, the thermal cyclization of the poly(amide-acids) to the corresponding polyimides can be performed in the same solvent by simply increasing the temperature to the required level. The same is feasible with phenolic solvents such as the cresols; the diaryl sulfones and ketones have the added advantage of low toxicity, however.

For most combinations of diamines and dianhydrides falling within the definition given above, it is possible to form compositions of 100% poly(amide-acid) by conducting the reaction below 100° C. However, temperatures up to 175° C and higher may be tolerated to provide shapeable compositions.

The degree of polymerization of the poly(amide-acid) is subject to deliberate control. The use of equal molar amounts of the reactants under the prescribed conditions provides poly(amide-acids) of high molecular weight. The use of either reactant in large excess limits the extent of polymerization. In addition to using an excess of one reactant to limit the molecular weight of the poly(amide-acid), a chain terminating agent such as phthalic anhydride may be used to "cap" the ends of the polymer chains. Typical useful capping agents are less than 5 wt. % of monoanhydrides or monoamines amine and anhydride shown below:

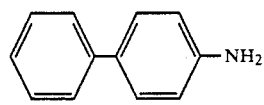

and

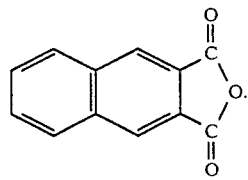

In the preparation of the poly(amide-acid), it is desired that the molecular weight be such that the inherent viscosity of the polymer is at least 0.1, preferably 0.3–1.5. The inherent viscosity is measured at 25° C at a concentration of 0.5% by weight of the polymer in a suitable solvent such as N-methylpyrolidone.

The quantity of organic solvent used in the process need only be sufficient to dissolve enough of one reactant, preferably the diamine, to initiate the reaction of the diamine and the dianhydride. It has been found that the most successful results are obtained when the solvent represents at least 60% of the final solution. That is, the solution should contain 0.05-40% of the polymeric component.

The second step of the process is performed by treating the poly(amide-acid) with a dehydrating agent, alone or in combination with a tertiary amine, such as acetic anhydride or an acetic anhydride-pyridine mixture. The ratio of acetic anhydride to pyridine can vary from just above zero to infinite mixtures.

In addition to acetic anhydride, lower fatty acid anhydrides and aromatic monobasic acid anhydrides may be used. The lower fatty acid anhydrides include propionic, butyric, valeric, and the like.

The aromatic monobasic acid anhydrides include the anhydride of benzoic acid and those of the following acids: o-, m-, and p-toluic acids; m- and p-ethyl benzoic acids; p-propyl benzoic acid; p-isopropyl benzoic acid; anisic acid; o-, m- and p-nitro benzoic acids; o-, m-, and p-halo benzoic acids; the various dibromo and dichloro benzoic acids; the tribromo and trichloro benzoic acids; and the like.

Tertiary amines having approximately the same activity as the preferred pyridine can be used in the process. These include isoquinoline, 3,4-lutidine, 3,5-lutidine, 4-methyl pyridine, 3-methyl pyridine, 4-isopropyl pyridine, N,N-dimethyl benzyl amine, 4-benzyl pyridine, and N,N-dimethyl dodecyl amine. These amines are generally used from 0.3 to equimolar amounts with that of the anhydride converting agent. Trimethyl amine and triethylene diamines are much more reactive, and therefore are generally used in still smaller amounts. On the other hand, the following operable amines are less reactive than pyridine: 2-ethylpyridine, 2-methyl pyridine, triethyl amine, N-ethyl morpholine, N-methyl morpholine, diethyl cyclohexylamine, N,N-dimethyl cyclohexylamine, 4-benzoyl pyridine, 2,4-lutidine, 2,6lutidine and 2,4,6-collidine, and are generally used in larger amounts.

Dehydration of the poly(amide-acid) to form the polyimide, that is imidization, can also be performed by heating the poly(amide-acid) solution to temperatures at or above 200° C at reflux to remove the water which is a by-product of the reaction. Additionally, a catalyst, such as ptoluenesulfonic acid, and/or an azcotrophing agent, such as monochlorobenzene, can be added to assist the thermal imidization.

A novel class of solvents for the polymerization of polyimides is the poly(arylsulfone)s of the present invention. The combination of the diamines and dianhydride can be added to the molten poly(arylsulfone]at temperatures between 200° and 400° C; preferably between 300° and 380° C. While not generally considered solvents for the poly(amide-acid) intermediates, these poly(arylsulfones) are by virtue of being miscible true solvents for the polyimides of this invention. However, because the reaction between the aromatic amine and anhydride end groups takes place at such high temperatures, the amideacid intermediate is never formed and thus the poly(arylsulfone) performs all of the desired functions of a good solvent including solubilization of the reaction product. Because of the relatively high viscosity of the resulting or other device capable of conveying viscous polymer solutions. Such devices are known in the art and are described in any good text on polymer processing such as J.L. Throne, "*Plastics Process Engineering*," Marcel Dekker, New York, 1979, hereby incorporated by reference. The extruder or other device should preferably be vented to provide for the removal of the by products (water) of the reaction. This process has several advantages. Firstly, because the processing takes place above 200° C, imidization occurs spontaneously and not in a separate step after the formation of the poly(amide acid). Secondly, the solvent (i.e., the poly(arylsulfone)) does not have to be removed via a recovery step after the polymerization is complete. Lastly, the blend is formed in situ and not during a subsequent compounding step. The elimination of these three intermediate steps results in considerably better economics.

The resulting polyimides of the instant invention can be homopolymers, random copolymers, and block copolymers. They have reduced viscosities as measured in N-methylpyrolidone at concentrations of 0.5% by weight at 25° C between 0.1 and 1.5 dl/g and higher.

The polyamide-imides of this invention may be made by methods well known in the art such as those described in U.S. Pat. No. 4,713,438.

The preparation of the poly(amide-imides) is preferably performed using reactions that are similar to those discussed for the preparation of the polyimides. This method of preparation will be referred to as Method C. Typically a tricarboxylic acid monoanhydride or derivative thereof is reacted with a diamine (or mixture of diamines) as shown below and as described in, for example, Japanese Patent Application Nos 61/126,136 and 61/126,137, hereby incorporated by reference.

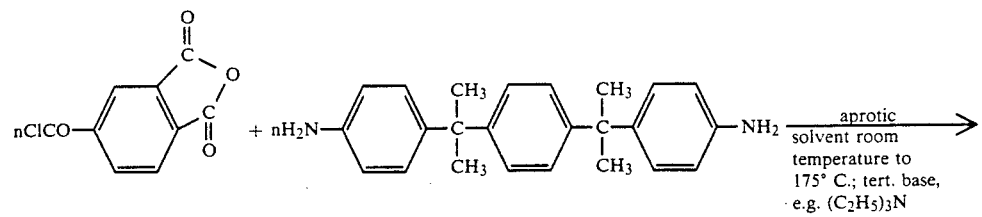

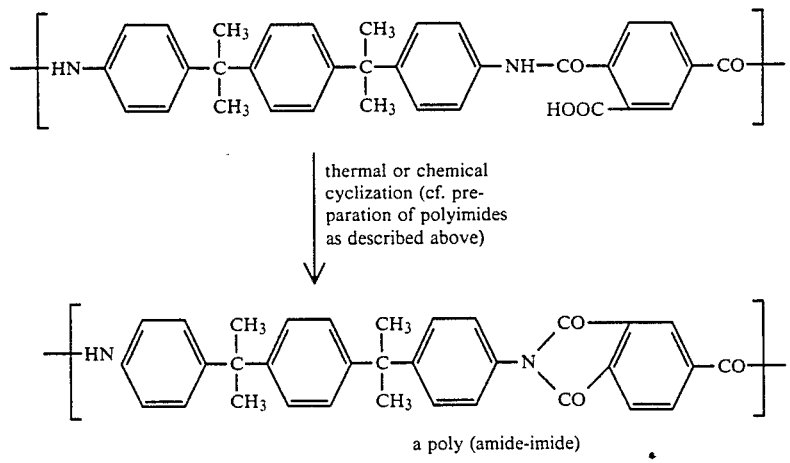

a poly (amide-imide)

Preferred tricarboxylic acid monoanhydride derivatives include 1,2,4-benzenetricarboxylic anhydride and 1,2,4-benzenetricarboxylic anhydride acid chloride. The preferred diamines include those described for the polyimides.

Typical aprotic solvents which are the same as those used for polyimides, e.g., N,N-dimethylacetamide or N-methylpyrrolidone, and the like are useful. In another embodiment, these polymers can be prepared via the reaction of diisocyanate and tricarboxylic acid monoanhydride. The reaction is base-catalyzed. See for example, Japanese Patent Application No. 61/14,218, hereby incorporated by reference. It is illustrated below:

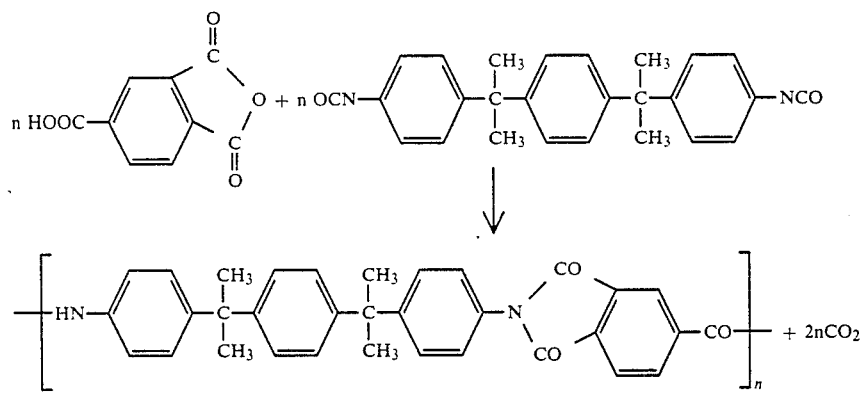

Experimental details are generally the same as those described for the corresponding preparation of the polyimides.

The resulting polyamide-imides of the instant invention can be homopolymers, random copolymers, and block copolymers. They have reduced viscosities as measured in N-methylpyrrolidone at concentrations of 0.5% by weight at 25° C between 0.1 and 1.5 dl/g and higher.

Not all blends containing the components mentioned above are miscible. However, a novel way has been determined to select those that are miscible with each other. It has been determined that the miscibility factor for the components must be negative for the components to be miscible and to form a polymer with a single glass transition temperature.

As mentioned previously, polymer miscibility cannot be predicted. There is recent evidence that once several examples are found where polymers of a class 1 are miscible with polymers of a class 2, then the phase behavior of blends of polymers of class 1 and polymers of class 2 can be correlated with structure. The net result is that a mathematical inequality can be written which correctly predicts when other polymers chosen from class 1 and class 2 are miscible. There is evidence that the miscibility of two polymers composed of several different types of mer units can be correlated by an equation of the type:

$$F_c > \sum_i \sum_{j>i} (\phi_i^1 \phi_j^2 + \phi_i^2 \phi_j^1 - \phi_i^1 \phi_j^1 - \phi_i^2 \phi_j^2) B_{ij} \quad (1)$$

where $F_c$ is a small number (or zero), the $\phi_i^k$ are related to the number of mers of type i in polymer K, and the $B_{ij}$ represents the interaction energy between mers of type i and j. A mer is a small substructual component of a polymer repeat unit. For example, in Paul, et al., Polymer 25, pp. 487-494 (1984), hereby incorporated by reference, the miscibility of the polyhydroxy ether of bisphenol A is successfully correlated with a series of aliphatic polyesters using (equation 10 in the above reference).

$$0 > B_{13}\phi_1' + B_{23}\phi_2' - B_{12}\phi_1'\phi_2' \quad (2)$$

Equation (2) is equivalent to equation (1) if the following change of notation is made:

$$F_c = 0$$

$\phi_1' = \phi_1^1$ $\phi_2' = \phi_2^1$ $\phi_3^2 = 1$ and all other $\phi_i^k = 0$.

In this case, the $\phi_i^k$ are taken to be the volume fraction mer i in polymer K. The $B_{ij}$ were essentially taken as adjustable parameters representing the enthalpy of interaction between group i and j. Paul and coworkers considered the polymer blend system to be made up of three groups, or mers:

(i) —CH$_2$— and (ii)

which make up the aliphatic polyesters, and

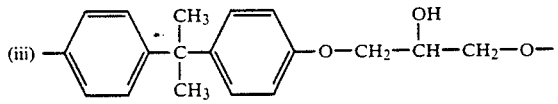

which makes up the polyhydroxy ether.

Kambour, et al, Macromolecules, 16, pp. 753–757 (1983) used a similar equation to correlate the miscibility of poly(styrene-co-bromostyrene) with poly(xylenyl cobromoxylenyl-ether), hereby incorporated by reference. In the case where polymer 1 contained only mers of type i and polymer contained mers of type j and k, the condition of miscibility that is arrived at is (see equation 4 on page 756 of the above cited work):

$$X_{AB}^C > (1-_c)X_{ij} + l_c(X_{ik}) - l_c(1-l_c)X_{kj} \quad (3)$$

Note the mistake in the third term of equation 4 in Kambour, et al, which is corrected in equation (3) above. Equation (3) is seen to be identical with equation (1) if the following change of notation is made:

$F_c = X_{AB}^C$ $\overline{X}_c = \phi_j^2$ $(1 - \overline{X}_c) = \phi_k^2$ $\phi_1^1 = 1$ All other $\phi_i^k = 0$.

$X_{ij} = B_{ij}$ for all i l j.

In this instance, Kambour has taken the $\phi_i^k$ to be the mole fraction mer i in polymer K. Again the $B_{ij}$ were taken to be adjustable parameters.

There is a precedent, then, for correlating miscibility using equation (1). We have seen that the $\phi_i^k$ may be interpreted as volume fractions or mole fractions. Prausnitz, et al, in the Properties of Gases and Liquids, Third Edition, published by McGraw Hill Book Co., New York, N.Y. (1977), hereby incorporated by reference, recommend the use of molecular area fractions in equations similar to equation (1) (See Chapter 8 in Prausnitz, et al). They recommend the use of the group contribution method developed by A. Bondi in the Physical Properties of Molecular Liquids, Crystals and Glasses, Chapter 14, published by John Wiley andSons, NewYokr, N.Y. (1968), hereby incorporated by refernce, for theestimatino of the surface area of mer units.

It has been foundthat when poly(aryl sulfones) are mixcible with imide containing polymers, the miscible blend comprises seperatly made biphenyl containing plysulfones with isoproylidene baed polyimides or amide-imides formed into an intimate moldable mixture byphysical methds such as metl extrusion.

Miscible combinations have been correlated for poly(aryl sulfone) and polyimide or amide-imide alloys. It is highly probable that they will be miscible if theMiscibilty Factor (MF) defined by the following equation is less than 0.05:

$$\begin{aligned}MF = &(\phi_1^1\phi_2^2 + \phi_1^2\phi_2^1 - \phi_1^1\phi_2^1 - \phi_1^2\phi_2^2)1.40 + \quad (4)\\ &(\phi_1^1\phi_3^2 + \phi_1^2\phi_3^1 - \phi_1^1\phi_3^1 - \phi_1^2\phi_3^2)0.27 +\\ &(\phi_1^1\phi_4^2 + \phi_1^2\phi_4^1 - \phi_1^1\phi_4^1 - \phi_1^2\phi_4^2) - 0.19 +\\ &(\phi_1^1\phi_5^2 + \phi_1^2\phi_5^1 - \phi_1^1\phi_5^1 - \phi_1^2\phi_5^2)0.35 +\\ &(\phi_1^1\phi_6^2 + \phi_1^2\phi_6^1 - \phi_1^1\phi_6^1 - \phi_1^2\phi_6^2)2.39 +\\ &(\phi_1^1\phi_7^2 + \phi_1^2\phi_7^1 - \phi_1^1\phi_7^1 - \phi_1^2\phi_7^2)3.91 +\\ &(\phi_2^1\phi_3^2 + \phi_2^2\phi_3^1 - \phi_2^1\phi_3^1 - \phi_2^2\phi_3^2)1.86 +\\ &(\phi_2^1\phi_4^2 + \phi_2^2\phi_4^1 - \phi_2^1\phi_4^1 - \phi_2^2\phi_4^2)1.31 +\\ &(\phi_2^1\phi_5^2 + \phi_2^2\phi_5^1 - \phi_2^1\phi_5^1 - \phi_2^2\phi_5^2)0.80 +\\ &(\phi_2^1\phi_6^2 + \phi_2^2\phi_6^1 - \phi_2^1\phi_6^1 - \phi_2^2\phi_6^2)2.58 +\\ &(\phi_2^1\phi_7^2 + \phi_7^2\phi_7^1 - \phi_2^1\phi_7^1 - \phi_2^2\phi_7^2)0.64 +\\ &(\phi_3^1\phi_4^2 + \phi_3^2\phi_4^1 - \phi_3^1\phi_4^1 - \phi_3^2\phi_4^2)0.36 +\\ &(\phi_3^1\phi_5^2 + \phi_3^2\phi_5^1 - \phi_3^1\phi_5^1 - \phi_3^2\phi_5^2)0.46 +\\ &(\phi_3^1\phi_6^2 + \phi_3^2\phi_6^1 - \phi_3^1\phi_6^1 - \phi_3^2\phi_6^2)5.17 +\\ &(\phi_3^1\phi_7^2 + \phi_3^2\phi_7^1 - \phi_3^1\phi_7^1 - \phi_3^2\phi_7^2)4.71 +\\ &(\phi_4^1\phi_5^2 + \phi_4^2\phi_5^1 - \phi_4^1\phi_5^1 - \phi_4^2\phi_5^2) - 0.04 +\\ &(\phi_4^1\phi_6^2 + \phi_4^2\phi_6^1 - \phi_4^1\phi_6^1 - \phi_4^2\phi_6^2)0.39 +\\ &(\phi_4^1\phi_7^2 + \phi_4^2\phi_7^1 - \phi_4^1\phi_7^1 - \phi_4^2\phi_7^2)3.91 +\\ &(\phi_5^1\phi_6^2 + \phi_5^2\phi_6^1 - \phi_5^1\phi_6^1 - \phi_5^2\phi_6^2)1.78 +\\ &(\phi_5^1\phi_7^2 + \phi_5^2\phi_7^1 - \phi_5^1\phi_7^1 - \phi_5^2\phi_7^2)0.57 +\\ &(\phi_6^1\phi_7^2 + \phi_6^2\phi_7^1 - \phi_6^1\phi_7^1 - \phi_6^2\phi_7^2)0.69.\end{aligned}$$

where $\phi_k^l$ is the area fraction mer K in polymer l (l=1 (PAES), 2(PI, PAI)). The mers are chosen from the list in Table I where their estimated molar surface areas are also given. The miscibility factor in Equation (4) may be thought of as a function of the composition of the PAES, designated by $\phi_1^1, \phi_2^1, \phi_3^1, \ldots \phi_m^l$, and the PI or PAI, by $\phi_1^2, \phi_2^2, \phi_3^2, \ldots \phi_n^2$.

If this function is less than 0.05, polymers 1 and 2 will be completely miscible. If this function is greater than 0.05, then polymers 1 and 2 will be for all practical purposes immiscible. Of course, when this function is near 0.05 then polymer 1 and 2 are likely to be partially miscible. The quantity $\phi_k^l$ may be calculated if the mole fractions of the various mers in polymer 1 are known. If $X_i$ is the mole fraction mer i in polymer 1, then $$\phi_k^l = \frac{X_k A_{k'}}{\Sigma X_i A_i}$$

where $A_i$ is the molar surface area of mer i (given in Table I) and the sum is over all types of mers which are given in Table The blends of this invention are at least partially miscible. Preferably, the blends of this invention are miscible in all proportions. Preferably, the blends contain from about 2 to about 98, more preferably, the blends contain from about 15 to about 85 weight % of the poly(aryl sulfone), the balance being the polyimide or amide-imide constituent. The individual concentrations are readily chosen by those skilled in the art.

The blends of this invention are prepared by conventional mixing methods. For example, the polymer components are mixed with each other and any other optional ingredients in powder or granular form in an extruder. The mixture is extruded into strands. The strands are chopped into pellets; the pellets are molded into the desired article.

Additives which may be used with the thermoplastic alloy include reinforcing and/or non-reinforcing fillers such as wollastonite, asbestos, talc, alumina, clay, mica, glass beads, fumed silica, gypsum, graphite powder, molydenum disulfide and the like; and reinforcement fibers such as aramid, boron, carbon, graphite, and glass. Glass fiber is the most widely used reinforcement in the form of chopped strands, ribbon, yarn, filaments, or woven mats. Mixtures of reinforcing and non-reinforcing fillers may be used, such as a mixture of glass fibers and talc or wollastonite. These reinforcing agents are used in amounts of from about 10 to about 80 weight percent, whereas the non-reinforcing fillers are used in amounts of up to 50 weight percent. Other additives include stabilizers, pigments, flame retardants, plasticizers, processing aids, coupling agents, lubricants, mold release agents, and the like. These additives are used in amounts which achieve the desired result. A particularly useful additive, especially when either of the blend constituents contains a carbonyl linkage, is a hydrate such as those described in U.S. patent application Ser. No. 291,966, filed Dec. 30, 1988, entitled Injection Moldable Blends of Poly(Etherketones) and Poly Amide-Imides to Smyser et al.

Examples

The following examples serve to give specific illustrations of the practice of this invention but are not intended to limit the scope of this invention. They are exemplary, not exclusive. The examples show the unexpected discovery noted above. Table II compiles the polymers used in the following blending experiments along with their structures in terms of $\phi_1{}^k, \phi_2{}^k \ldots \phi_7{}^k$.

EXAMPLE 1

A 50/50 blend of PAES-I (Radel R5000 obtained from Amoco Performance Products, RV =0.56 dl/g as measured in 0.5% N-methylpyrolidone (NMP) solution at 25° C) and PAI-I, as defined in Table II, (I.V.=0.90 dl/g as measured in 0.5% NMP solution at 25° C) are melt mixed in a Brabender mixing head at 360° C and 50 RPM for five minutes. The blend is compression molded into a 4×4×0.02 inch plaque at about 350° C. The molded plaque is observed to be transparent with low haze. The plaque is tested for tensile strength, 1% secant modulus and elongation at break according to a procedure similar to ASTM D 638. The pendulum impact strength of the plaque is also measured.

Pendulum impact strength is measured as follows. A steel pendulum is used, cylindrical in shape with a diameter of 0.83 inch and weighing 1.562 pounds. The striking piece, mounted almost at the top of the pendulum, is a cylinder 0.3 inch in diameter. Film specimens, 4 inches long, 0.125 inch wide and about 1 to 30 mils thick are clamped between the jaws of the tester so that the jaws are spaced one inch apart. The 0.125 inch width of the film is mounted vertically. The pendulum is raised to a constant height to deliver 1.13 foot pounds at the specimen. When the pendulum is released, the cylindrical striking piece hits the specimen with its flat end, breaks the film, and travels to a measured height beyond. The difference in the recovery height (i.e., the difference in the potential energy of the pendulum at the maximum point of the upswing), represents the energy absorbed by the specimen during the rupture. The impact strength, expressed in foot-pounds per cubic inch, is obtained by dividing the pendulum energy loss by the volume of the specimen.

The modulus-temperature and resilience-temperature relationship for the blend is determined using an Instron testing device equipped with a sample chamber capable of being heated to 400° C at 1.6° C/min. From this information, the (Tg or Tgs) of the blend is (are) extracted as the minimum (minima) in the resilience-temperature curve at a strain rate of 0.2 inches/minute. See the discussion in Olabisi et al, *Polymer-Polymer Miscibility*, pp. 126–127, Academic Press, New York (1979), for a discussion of the modulus-resilience method. The results of the testing are shown in Table III.

EXAMPLE 2

(Comparative)

Example 1 is repeated except PAES-II (Victrex PES-200P obtained from ICI Americas RV =0.5 dl/g as measured in 0.5% NMP solution at 25° C) is substituted for PAES-I and the composition is 60/40 PAES-II/PAI-I. The molded plaque is translucent with noticeable haze. The results of hteteating are given in Table III.

TABLE I

| | | MERS |
|---|---|---|
| Index | Surface Area (cm²/mole) | Structure of Mer |
| 1 | 4.96 × 10⁹ | 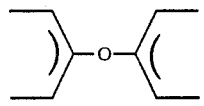 |
| 2 | 7.02 × 10⁹ | 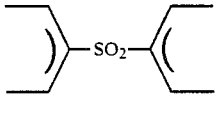 |
| 3 | 8.84 × 10⁹ | 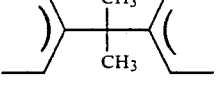 |
| 4 | 4.6 × 10⁹ | 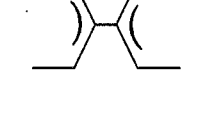 |
| 5 | 6.02 × 10⁹ |  |

TABLE I-continued

| | MERS | |
|---|---|---|
| Index | Surface Area (cm$^2$/mole) | Structure of Mer |
| 6 | 7.06 × 10$^9$ | [structure: imide ring with N] |
| 7 | 7.01 × 10$^9$ | [structure: amide —C(=O)—NH—] |

TABLE II

POLYMERS USED IN BLENDING EXPERIMENTS

Poly(aryl sulfones)

| PAES | Diahalobenzenoid Compound(s) | Mole % | Dihydric Phenol(s) | Mole % | Method of Preparation | Composition of Resultant Poly(aryl sulfone) | | | | | | |
|---|---|---|---|---|---|---|---|---|---|---|---|---|
| | | | | | | $\Phi_1^1$ | $\Phi_2^1$ | $\Phi_3^1$ | $\Phi_4^1$ | $\Phi_5^1$ | $\Phi_6^1$ | $\Phi_7^1$ |
| I | DCDPS | 100 | BP | 100 | A | 0.46 | 0.33 | 0 | 0.21 | 0 | 0 | 0 |
| II | DCDPS | 100 | BisS | 100 | A | 0.41 | 0.59 | 0 | 0 | 0 | 0 | 0 |
| III | DCDPS | 100 | BisA | 100 | A | 0.39 | 0.27 | 0.34 | 0 | 0 | 0 | 0 |
| IV | DCDPS | 100 | HQ | 80 | A | 0.56 | 0.39 | 0 | 0.05 | 0 | 0 | 0 |
| | | | BP | 20 | | | | | | | | |
| V | BCPSB | 100 | HQ | 50 | A | 0.32 | 0.46 | 0 | 0.22 | 0 | 0 | 0 |
| | | | BP | 50 | | | | | | | | |
| VI | DCDPS | 100 | BisS | 75 | A | 0.45 | 0.55 | 0 | 0 | 0 | 0 | 0 |
| | | | HQ | 25 | | | | | | | | |
| VII | BCPSB | 100 | BP | 100 | A | 0.30 | 0.42 | 0 | 0.28 | 0 | 0 | 0 |

Polyamide-imides

| PAI | Triacid anhydride acid chloride or dianhydride or diacid Chloride | Mole % | Diamine | Mole % | Method of Preparation | Composition of Resultant Polyamide-imide | | | | | | |
|---|---|---|---|---|---|---|---|---|---|---|---|---|
| | | | | | | $\Phi_1^2$ | $\Phi_2^2$ | $\Phi_3^2$ | $\Phi_4^2$ | $\Phi_5^2$ | $\Phi_6^2$ | $\Phi_7^2$ |
| I | 4-TMAC* | 100 | BAP | 100 | C | 0 | 0 | 0.56 | 0 | 0 | 0.22 | 0.22 |
| II | 4-TMAC | 65 | BAPP | 100 | C | 0.30 | 0 | 0.27 | 0 | 0 | 0.29 | 0.14 |
| | PMDA | 35 | | | | | | | | | | |
| III | 4-TMAC | 100 | BAA | 100 | C | 0 | 0 | 0.38 | 0 | 0 | 0.31 | 0.31 |
| IV | 4-TMAC | 100 | BAPP | 100 | C | 0.30 | 0 | 0.28 | 0 | 0 | 0.21 | 0.21 |
| V | 4-TMAC | 100 | OBA | 70 | C | 0.20 | 0 | 0 | 0 | 0 | 0.40 | 0.40 |
| | | | MPD | 30 | | | | | | | | |
| VI | 4-TMAC | 50 | MPD | 100 | C | 0 | 0 | 0 | 0 | 0 | 0.25 | 0.75 |
| | IAC** | 50 | | | | | | | | | | |

*Trimethylacetamide
**Isophthalic acid chloride

Polyimides

| PI | Dianhydride | Mole % | Diamine | Mole % | Method of Preparation | Composition of Resultant Polyamide-imide | | | | | | |
|---|---|---|---|---|---|---|---|---|---|---|---|---|
| | | | | | | $\Phi_1^2$ | $\Phi_2^2$ | $\Phi_3^2$ | $\Phi_4^2$ | $\Phi_5^2$ | $\Phi_6^2$ | $\Phi_7^2$ |
| I | IPAN | 100 | BAA | 100 | B | 0 | 0 | 0.56 | 0 | 0 | 0.44 | 0 |
| II | IPAN | 100 | BAP | 100 | B | 0 | 0 | 0.65 | 0 | 0 | 0.35 | 0 |
| III | IPAN | 100 | OBA | 100 | B | 0.18 | 0 | 0.32 | 0 | 0 | 0.50 | 0 |
| IV | IPAN | 100 | MPD | 100 | B | 0 | 0 | 0.39 | 0 | 0 | 0.61 | 0 |
| V | BPDA | 100 | BAA | 100 | B | 0 | 0 | 0.32 | 0.17 | 0 | 0.51 | 0 |
| VI | BPDA | 100 | BAP | 100 | B | 0 | 0 | 0.48 | 0.13 | 0 | 0.39 | 0 |
| VII | BTDA | 100 | BAA | 100 | B | 0 | 0 | 0.30 | 0 | 0.21 | 0.49 | 0 |
| VIII | BTDA | 100 | BAP | 100 | B | 0 | 0 | 0.47 | 0 | 0.16 | 0.37 | 0 |

EXAMPLE 3

(Comparative)

A 50/50 blend of PAES-III (Udel P-1700 obtained from Amoco Performance Products, RV =0.5 dl/g as measured in 0.5% CHC13 solution at 23° C) and PAI-I is made by dissolving 3 grams of each in NMP to make a 10% solution. It is coagulated into an 80/20 water/-methanol mixture and filtered. The filtrate is reslurried in water and boiled for 5 hours, refiltered, and dried. The dry cake is compression molded as in Example 1. Its Tgs are determined as in Example 1 and are given in Table III.

Controls A, B, C and D

PAES-I, PAES-II, PAES-III, and PAI-I are compression molded at about 350° C. The moldings are tested as in Example 1. The results of the testing are given in Table III.

As can be seen, the blend of PAES-I and PAI-I is miscible by virtue of its intermediate single Tg and transparency. Conversely, blends of PAES-II or PAES-III with PAI-I are seen to be immiscible as two Tgs are detected and by virtue of the poor optical properties of the blends.

EXAMPLE 4

A 50/50 blend of PAES-I and PAI-II (I.V. =0.25 dl/g as measured in 0.5% NMP solution at 25° C) is melt homogenized in a Brabender mixing head at 360° C and 50 rpm. The blend is molded and tested as in Example 1 with the exception that the Tg is determined using a Polymer Laboratories DMTA operating in tensile mode at 10 Hz and scanning at 5° C/min. The Tg is taken as the maximum in the tan curve. The results are given in Table III. The molding is transparent with little haze.

EXAMPLE 5

(Comparative)

A 50/50 blend of PAES-III and PAI-II is melt homogenized in a Brabender mixing head at 360° C and 50 rpm. The blend is molded and tested as in Example 4. The results are given in Table III. The molding is translucent with significant haze.

EXAMPLE 6

(Comparative)

A 50/50 blend of PAES-IV (RV =0.92 as measured in a 1% NMP solution at 25° C) and PAI-II is melt homogenized in a Brabender mixing head at 360° C and 50 rpm. The blend is molded III. The molding is translucent with considerable haze.

Controls E and F

PAI-II (I.V. =0.79 dl/g as measured in 0.5% NMP solution at 25° C; same as used in Example 4, except solid state advanced to a higher MW) and PAES-IV are compression molded into 4x4x0.20 inch plaques at 360° C and tested as in Example 4. The results are given in Table III.

EXAMPLE 9

(Comparative)

A 50/50 blend of PAES-VI (Radel A 400 obtained from Amoco Performance Products, RV=0.48 dl/g as measured in 1.0% NMP solution at 25° C) is made and tested as in Example 7. The results are given in Table IV.

Controls A, G, H, I

PI-I and PAES-I, V and VI are compression molded into 4×4×0.02 inch plaques at 360°–380° C. The moldings are tested as in Example 7 and the results are given in Table IV.

One of the advantages of a miscible blend as opposed to an immiscible blend (in addition to transparency) is demonstrated in the last column of Table IV. PAES-I and PAESVI have similar Tgs and HDTs, yet the former is miscible with PI-I while the latter is not. A 50/50 blend with PI-I increases the HDT of PAES-I by 32° C to 246° C while it increases the HDT of PAES-VI by only 8° C to 224° C. A significant improvement in the HDT of PAES-V, which is also miscible with PI-I, is observed on blending.

TABLE III

BLEND PROPERTIES

| Example | Component I | Component II | Tensile Strength (psi) | Elongation (%) | Modulus (ksi) | Pendulum Impact Strength (ft-lb/in$^3$) | Tg(s) (°C.) |
|---|---|---|---|---|---|---|---|
| 1 | 50% PAES-I | 50% PAI-I | 11,400 | 16 | 236 | 121 | 242 |
| 2 | 60% PAES-II | 40% PAI-I | 12,700 | 8.4 | 275 | 72 | 232,278 |
| 3 | 50% PAES-III | 50% PAI-I | — | — | — | — | 185,265 |
| Control A | 100% PAES-I | — | 9,920 | 75 | 230 | 184 | 223 |
| Control B | 100% PAES-II | — | 12,000 | 26 | 245 | 116 | 229 |
| Control C | 100% PAES-III | — | 9,710 | 40 | 234 | 152 | 185 |
| Control D | 100% PAI-I | — | 14,300 | 13 | 289 | 97 | 270 |
| 4 | 50% PAES-I | 50% PAI-II | 11,200 | 17 | 255 | 238 | 235 |
| 5 | 50% PAES-III | 50% PAI-II | — | — | — | — | 184,236 |
| 6 | 50% PAES-IV | 50% PAI-II | — | — | — | — | 215,260 |
| Control E | 100% PAI-II | — | — | — | — | — | 245 |
| Control F | 100% PAES-IV | — | — | — | — | — | 210 |

EXAMPLE 7

A 50/50 blend of PAES-I and PI-I (RV =0.60 dl/g as measured in 0.5% NMP solution at 25° C) is made by dissolving 2.5 grams of each in dimethylacetamide (DMAC) at 25° C to make a 20% solution. It is coagulated in a Waring blender filled with a methyl alcohol/water mixture. The resultant coagulant is filtered and dried overnight under vacuum at 200° C. The next morning it is compression molded into a 2x2x0.010 inch plaque at-360° C. The Tg of the plaque is measured using a Polymer Laboratories DMTA operating in the tensile mode at 1 Hz and scanning at 3° C/min. The HDT of the blend at 264 psi is estimated as the temperature where the modulus of the blend dropped to 100,000 psi as suggested by M.T. Takemori in the *SPE Proceeding of ANTEC*, pp. 216-219 (Apr. 24-27, 1978), hereby incorporated by reference. Results of the testing are given in

EXAMPLE 8

A 50/50 blend of PAES-V (RV =0.57 dl/g as measured in a 1% NMP solution at 25° C) and PI-I is made and tested as in Example 7. The results are given in Table IV.

TABLE IV

BLEND PROPERTIES

| Example | Component I | Component II | Tg(s) (°C.) | HDT* (°C.) |
|---|---|---|---|---|
| 7 | 50% PAES-I | 50% PI-I | 259 | 246 |
| 8 | 50% PAES-V | 50% PI-I | 283 | 263 |
| 9 | 50% PAES-VI | 50% PI-I | 227,277 | 224 |
| Control A | 100% PAES-I | — | 223 | 214 |
| Control G | 100% PI-I | — | 292 | 281 |
| Control H | 100% PAES-V | — | 263 | 240 |
| Control I | 100% PAES-VI | — | 225 | 216 |

*Estimated at 264 psi.

EXAMPLES 10 THROUGH 35

The phase behavior of the blends of Examples 1 through 9 are summarized in Table V. Further, the phase behavior of several additional 50/50 blends of various poly(aryl sulfones) with various polyimides and amide-imides are also summarized in Table V as Examples 10 through 35. The blends are made by the same methods used to prepare Examples 1 through 9, except where noted. The blends are compression molded and the Tg(s) of the moldings are determined by a) modulus/resilience, b) DMTA or c) DSC. The blends are judged to be miscible (immiscible) on the basis of one (two) Tg(s) existing between (similar to) those of the constituents Only poly(aryl sulfones) containing biphenyl linkages are found to be miscible with polyimides or amide-imides. Thus, biphenyl linkages in the poly(aryl sulfone) appear to be necessary. Further, the polyimides 18), immiscible (Example 32) or partially miscible (Example 16). Thus the deviation of the Miscibility Factor from the value of 0.05 is a measure of the blend compatibility.

TABLE V

Observed Phase Behavior of 50/50 Blends of Various Poly(aryl sulfones) with Various Polyimides and Polyamide-imides

| Example | PAES Compound | Biphenyl Group in Repeat Unit | Imide Containing Compound | Method of Forming Blend | Observed Phase Behavior | Miscibility Factor of Equation 4 |
|---|---|---|---|---|---|---|
| 1 | PAES-I | YES | PAI-I | 2 | Miscible | −0.01 |
| 2 | PAES-II | NO | PAI-I | 2 | Immiscible | 0.07 |
| 3 | PAES-III | NO | PAI-I | 1 | Immiscible | 0.21 |
| 4 | PAES-I | YES | PAI-II | 2 | Miscible | 0.04 |
| 5 | PAES-III | NO | PAI-II | 2 | Immiscible | 0.39 |
| 6 | PAES-IV | SOME | PAI-II | 2 | Immiscible | 0.12 |
| 7 | PAES-I | YES | PI-I | 4 | Miscible | −0.21 |
| 8 | PAES-V | YES | PI-I | 4 | Miscible | −0.14 |
| 9 | PAES-VI | NO | PI-I | 4 | Immiscible | 0.12 |
| 10 | PAES-VI | NO | PAI-III | 1 | Immiscible | 0.27 |
| 11 | PAES-II | NO | PAI-III | 1 | Immiscible | 0.27 |
| 12 | PAES-I | YES | PAI-III | 1 | Immiscible | 0.29 |
| 13 | PAES-III | NO | PAI-III | 1 | Immiscible | 0.70 |
| 14 | PAES-VI | NO | PAI-II | 2 | Immiscible | 0.21 |
| 15 | PAES-II | NO | PAI-II | 2 | Immiscible | 0.23 |
| 16 | PAES-V | YES | PAI-II | 2 | Partially Miscible* | 0.05 |
| 17 | PAES-VIII | YES | PAI-II | 1 | Miscible | 0.01 |
| 18 | PAES-V | YES | PAI-IV | 2 | Miscible | 0.05 |
| 19 | PAES-VI | NO | PAI-V | 2 | Immiscible | 1.04 |
| 20 | PAES-II | NO | PAI-V | 2 | Immiscible | 1.02 |
| 21 | PAES-VI | NO | PAI-VI | 2 | Immiscible | 1.72 |
| 22 | PAES-II | NO | PAI-VI | 2 | Immiscible | 1.65 |
| 23 | PAES-I | YES | PI-V | 2 | Immiscible | 0.17 |
| 24 | PAES-V | YES | PI-V | 2 | Immiscible | 0.23 |
| 25 | PAES-II | NO | PI-VI | 2 | Immiscible | 0.29 |
| 26 | PAES-I | YES | PI-VI | 2 | Miscible | −0.08 |
| 27 | PAES-III | NO | PI-VI | 2 | Immiscible | 0.29 |
| 28 | PAES-I | YES | PI-IV | 2 | Immiscible | 0.05 |
| 29 | PAES-I | YES | PI-VIII | 2 | Miscible | −0.13 |
| 30 | PAES-V | YES | PI-VIII | 2 | Miscible | −0.06 |
| 31 | PAES-II | NO | PI-II | 2 | Immiscible | 0.14 |
| 32 | PAES-III | NO | PI-II | 3 | Immiscible | 0.05 |
| 33 | PAES-II | NO | PI-I | 3 | Immiscible | 0.16 |
| 34 | PAES-I | YES | PI-III | 2 | Miscible | 0.01 |
| 35 | PAES-VIII | YES | PI-III | 1 | Miscible | 0.00 |

Methods of Forming the Blends
1 = Solution Blend as in Example 3
2 = Melt blend made in Brabender as in Example 1
3 = Solution Blend as in Example 3 Except methylene chloride was used as the solvent instead of N-methyl pyrolidone
4 = Solution Blend as in Example 7
*Blend determined to be partially miscible by transmission and scanning electron microscopy. Electron dispersive spectroscopy was used to contrast the poly(aryl sulfone) rich phase. Tgs of the constituents were too close together to determine phase behavior by mechanical or calorimetric methods.

or amide imides all contain an isopropylidene group. Imide groups in conjunction with isopropylidene groups also appear to be necessary as no polyamide or amide-imide not containing an isopropylidene linkage is found to be miscible with a poly(aryl sulfone)

The required proportions of biphenyl linkages in the PAES and isopropylidene linkages in the PI or PAI are determined by Equation 4. If the Miscibility Factor is less than 0.05 then the blend will very likely be miscible in all proportions. If the Miscibility Factor is very near 0.05, a borderline case exists and the blend may be miscible or immiscible, or most likely partially miscible. Finally, if the Miscibility Factor is greater than 0.05 then the blend will very likely be immiscible and not within the scope of this invention.

The last column in Table V gives the value of the Miscibility Factor calculated for the particular polymer combination given in columns 2 and 4. As can be seen, the Miscibility Factor is less than or equal to 0.05 in every miscible example. Likewise, the Miscibility Factor is greater than or equal to 0.05 in every immiscible example. Note that when the Miscibility Factor is equal to 0.05, then the Example may be miscible (Example

EXAMPLE 36

A 50/50 blend of PAES-I (RADEL R5000 obtained from Amoco Performance Products, Inc.) and PAI-II (I.V.=0.30 dl/g as measured in 0.5% NMP solution at 25° C) is made in a one inch single screw (L/D=36) extruder at about 350° C. The extrudate is chopped into pellets, dried to remove absorbed moisture and injection molded at about 340° C into ASTM test specimens. The molded blend is tested as shown in Table VI.

EXAMPLE 37

(Comparative)

A 50/50 blend of PAES-II (Victrex 200P obtained f.rom I.C.I. Americas, Inc.) and PAI-II (same as in Example 36) is given in Table VI.

Controls J and K

Pellets of the PAES-I and PAES-II of Examples 36 and are injection molded and tested in Example 36. The results are given in Table VI.

All of the polyimides, polyamide-imides and poly(aryl sulfones) discussed up to this point are made by conventional solution techniques. The following is an example of a polyimide made in an extruder using a poly(aryl sulfone) as the solvent

EXAMPLE 38

A 60/40 blend of PAES-I and PI-VI is made in the following manner. A dry mixture of:

| |
|---|
| 53.85% BAP |
| 44.70% BPDA |
| 1.39% Phthalic Anhydride |
| 100.00% | is thoroughly homogenized. Forty percent of this mixture is added to 60% of the PAES-I of Example 36 and extruded in a single screw one inch diameter (L/D =36) Killion extruder. The extruder has seven zones, including the die, and two vents. The equally spaced seven zones from the rear to the die of the extruder have the following temperatures: cold, 570° F, 570° F, ° F, 670° F and 670° F. Under the above conditions, the mixture is extruded at about 2 pounds/hour chopped into pellets and then reextruded a second time. The second time through the zone temperatures are all raised to 700° F, otherwise conditions are the same. The extrudate is chopped, diced, and injection molded at about ° F into a 300° F mold. The resulting ASTM test specimens are used to determine the properties given in Table VI.

EXAMPLE 39

A 60/40 blend of PAES-II and PI-VI is made in the following manner. A dry mixture of:

| |
|---|
| 53.85% BAP |
| 44.70% BPDA |
| 1.39% phthalic Anhydride |
| 100.00% | is thoroughly homogenized. Forty percent of this mixture is added to 60% PAES-II of Example 37 and extruded under identical conditions given in Example 38. The resulting pellets are injection molded and tested as shown in Table VI.

Examples 36 through 39 clearly depict the advantages of miscible blends over immiscible blends. For example, consider heat distortion temperature (HDT). PAES-I and PAES-II have similar Tgs and heat distortion temperatures (214° C for PAES-I and 224° C for PAES-II). Blending each with PAI-II to make a 50% blend resulted in the increase in HDT depicted in Table VII. Likewise, a blend of each with PI-VI to make a 40% blend resulted in the increase in HDT also shown in Table VII. Recall that PAES-I is miscible with both PAI-II and PI-VI (See Table V, Examples 4 and 26) while PAES-II is immiscible with both (See Table V, Examples 15 and 25). Thus, it is seen that miscibility resulted in a substantial increase in HDT while immiscibility resulted in very little.

Comparing Examples 36 to 37 and 38 to 39, it is also seen that miscibility produced a substantial benefit in toughness. The miscible blends (Examples 36 and 38) have significantly higher elongations at break, tensile impact strengths, and unnotched Izods than their immiscible counterparts (Examples 37 and 39) even though these values for the two controls (J and K) are almost identical.

The improvement in environmental stress rupture resistance (chemical) is also dramatic. Tensile bars of controls J and K and Examples 36 and 37 are loaded in flexure to an outer fiber stress of 3000 psi. Methylethylketone (MEK) is applied to the surfaces. MEK is a common ingredient of paint thinners. The times required for the bars to rupture are given in Table VIII. Note that both controls are rapidly attacked by MEK and that the immiscible blend is not significantly better. The miscible blend of PAES-I and PAI-II, however, is unaffected by MEK for an extended period of time.

TABLE VI

| Composition | ASTM Test Method | Control J PAES I | Control K PAES II | Example 36 50% PAES-I 50% PAI-II | Example 37 50% PAES-II 50% PAI-II | Example 38 60% PAES-I 40% PI-VI | Example 39 60% PAES-II 40% PI-VI |
|---|---|---|---|---|---|---|---|
| Tensile Strength (psi) | D-638 | 10,700 | 12,000 | 11,500 | 12,400 | 12,600 | 10,800 |
| Elongation (%) | D-638 | 84 | 112 | 41 | 10 | 11 | 3.5 |
| Tensile Modulus (ksi) | D-638 | 344 | 398 | 412 | 452 | 423 | 452 |
| Tensile Impact (ft-lb/in$^2$) | D-1822 | 144 | 137 | 111 | 88 | 57 | 19 |
| Heat Deflection* Temperature @264 psi (C.) | D-648 | 214 | 224 | 224 | 223 | 230 | 225 |
| Unnotched Izod @ ⅛" (ft-lb/in) | D-256 | No Break | No Break | No Break | 63 | 35 | 11 |

*Samples annealed at 200° C. for 4 hours prior to testing.

TABLE VII

| | EFFECT OF MISCIBILITY ON HDT | | | |
|---|---|---|---|---|
| | Example 36 (Miscible) | Example 37 (Immiscible) | Example 38 (Miscible) | Example 39 (Immiscible) |
| Example Composition | -50% PAI-II- | | -40% PI-VI- | |
| | 50% PAES-I | 50% PAES-II | 60% PAES-I | 60% PAES-II |
| Increase in HDT °C. over | 10 | −1 | 16 | +1 |

TABLE VII-continued
EFFECT OF MISCIBILITY ON HDT

| Example | Example 36 (Miscible) | Example 37 (Immiscible) | Example 38 (Miscible) | Example 39 (Immiscible) |
|---|---|---|---|---|
| Composition | -50% PAI-II- | | -40% PI-VI- | |
| PAES Component | 50% PAES-I | 50% PAES-II | 60% PAES-I | 60% PAES-II |

TABLE VIII
CHEMICAL RESISTANCE

| | Control J | Control K | Example 36 | Example 37 |
|---|---|---|---|---|
| Composition | PAES-I | PAES-II | 50% PAES-I 50% PAI-II | 50% PAES-II 50% PAI-II |
| MEK at 23° C. and 3000 psi | Rupture after 5 min. | Immediate Rupture | No effect after 24 hrs. | Immediate Rupture |

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

We claim:

1. A miscible blend of poly(arylsulfone) and a polyimide or polyamide-imide comprising: (a) poly(aryl sulfone) containing the following unit:

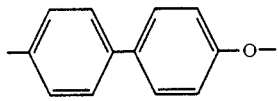

and (b) polyimide or polyamide-imide containing the following unit:

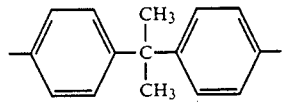

with the proviso that when the polymer containing the biphenyl isopropylidene group is a polyimide, the polyimide has the following recurring unit:

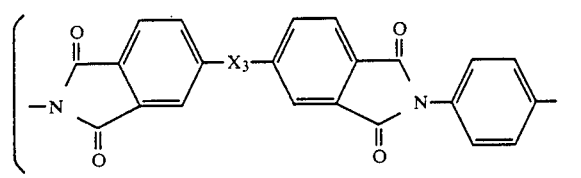

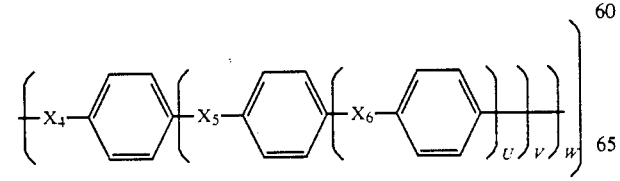

wherein $X_3$, $X_4$, $X_5$ and $X_6$ are independently

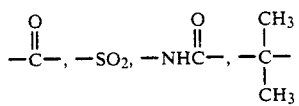

or a direct bond with the proviso that at least oen of $X_3$, $X_4$, $X_5$ and $X_6$ is isopropylidene, adn U, V, and W are independnetly 0 or 1, with the proviso that at least oe of U or V is 1.

2. The miscible blend according to claim 1, wherein the poly(arylsulfone) comprises units of the following structure:

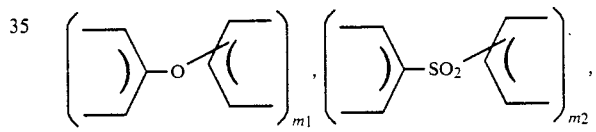

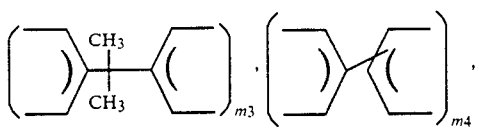

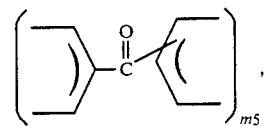

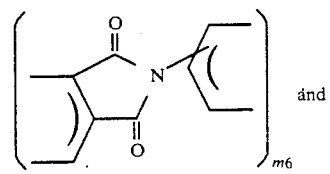

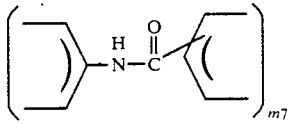

in the molar ratios given by $m_1 \ldots m_7$, wherein $m_1 \ldots m_7$ are between 0 and 1, with the proviso that $m_2$ and $m_4$ are not equal to 0, sadi units being connected by oxygen, and the polyimide or polyamide-imide comprises units of the following structure:

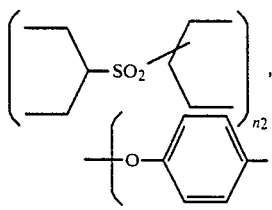

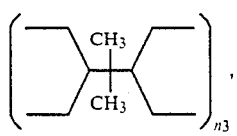

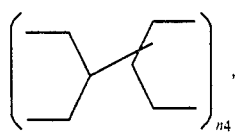

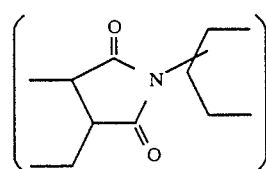

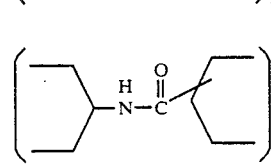

and

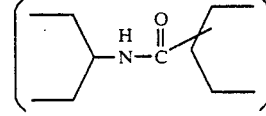

in the molar ratios given by $n_1^2 \ldots n_7$, wherein $n_2 \ldots n_7$ are between 0 and 1 with the proviso that $n_3$ and $n_6$ are not equal to 0.

3. The blend according to claim 1, wherein the poly(aryl sulfone) contains the following recurring unit:

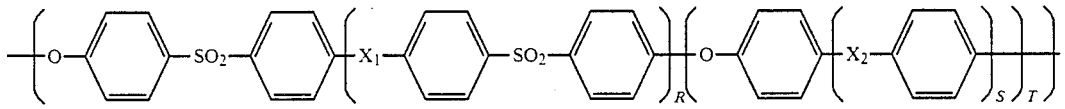

where $X_1$ and $X_2$ are independently —O—, —C—, —SO$_2$—,

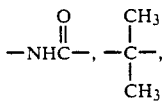

or a direct bond with the proviso that at least one of $X_1$ and $X_2$ is a direct bond, and R, S and T are independnetly 0 or 1 with the proviso that at least one of R or S is 1.

4. A miscible blend according to claim 3, wherein the biphenyl containing poly(aryl sulfone) contains the following recurring unit:

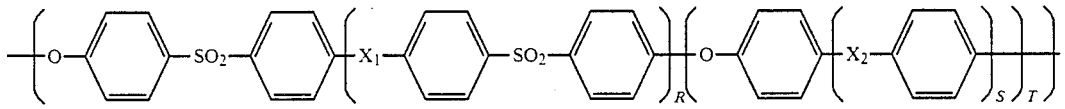

and the isopropylidene based polyamide-imide contains the following recurring unit:

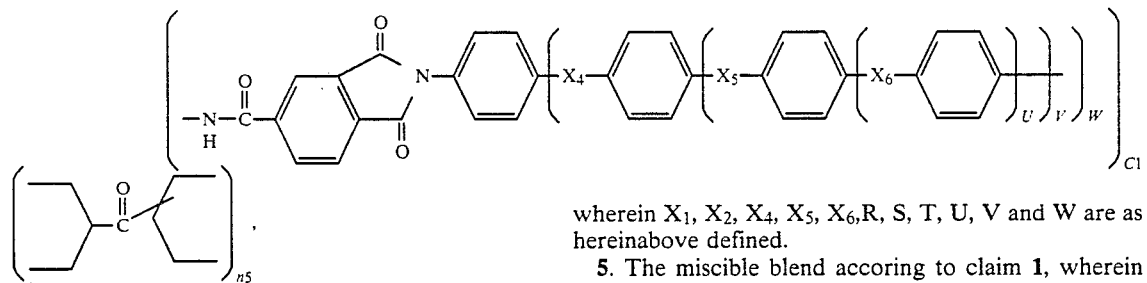

wherein $X_1$, $X_2$, $X_4$, $X_5$, $X_6$, R, S, T, U, V and W are as hereinabove defined.

5. The miscible blend accoring to claim 1, wherein the poly(aryl sulfone) comprises polymers or copolymers having the following recurring unit:

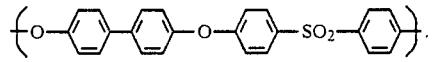

6. The miscible blend according to claim 1, wherein the poly(aryl sulfone) comprises polymers or copolymers having the following recurring unit:

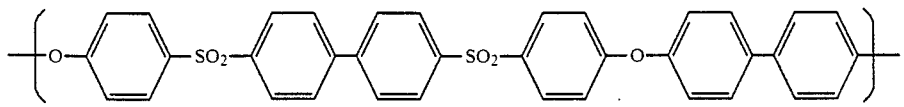

7. The miscible blend according to claim 1, wherein the poly(aryl sulfone) contains the following recurring unit:

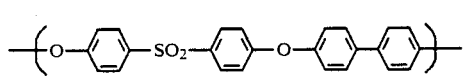

8. The miscible blend according to claim 1, wherein the poly(aryl sulfone) contains the following recurring unit:

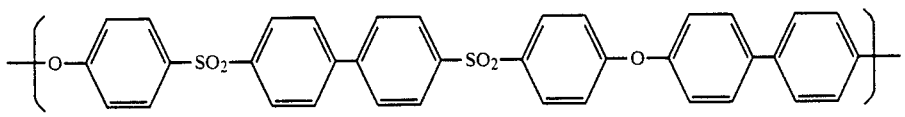

9. The miscible blend according to claim 1, wherein the polyimide comprises polymers or copolymers having the following recurring unit:

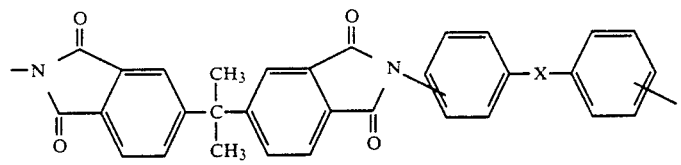

where

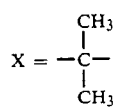

or direct bond.

10. The blend according to claim 1, wherein the polyimide contains the following recurring unit:

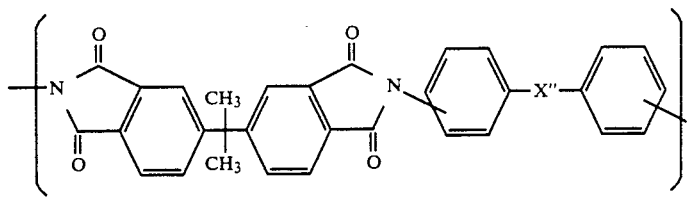

wherein X″ is

11. The miscible blend according to claim 1, wherein the polyimide contains the following recurring unit:

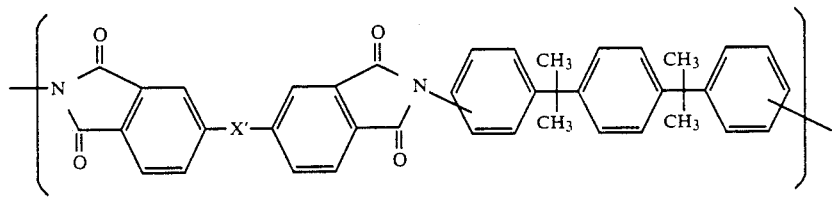

wherein X′ is

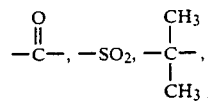

or direct bond.

12. The miscible blend according to claim 1, wherein the polyamide-imide contains the following recurring unit:

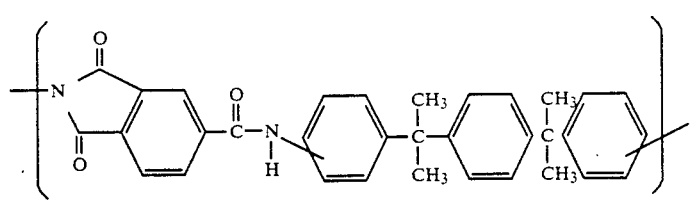

13. The miscible blend of a poly(arylsulfone) and a polyimide or ply(amide-imide) of claim 1, wherein the region of misciblity is specified by the following equation:

$$(\phi_1^1\phi_2^2 + \phi_1^2\phi_2^1 - \phi_1^1\phi_2^1 - \phi_1^2\phi_2^2)1.40 +$$
$$(\phi_1^1\phi_3^2 + \phi_1^2\phi_3^1 - \phi_1^1\phi_3^1 - \phi_1^2\phi_3^2)0.27 +$$
$$(\phi_1^1\phi_4^2 + \phi_1^2\phi_4^1 - \phi_1^1\phi_4^1 - \phi_1^2\phi_4^2) - 0.19 +$$
$$(\phi_1^1\phi_5^2 + \phi_1^2\phi_5^1 - \phi_1^1\phi_5^1 - \phi_1^2\phi_5^2)0.35 +$$
$$(\phi_1^1\phi_6^2 + \phi_1^2\phi_6^1 - \phi_1^1\phi_6^1 - \phi_1^2\phi_6^2)2.39 +$$
$$(\phi_1^1\phi_7^2 + \phi_1^2\phi_7^1 - \phi_1^1\phi_7^1 - \phi_1^2\phi_7^2)3.91 +$$
$$(\phi_2^1\phi_3^2 + \phi_2^2\phi_3^1 - \phi_2^1\phi_3^1 - \phi_2^2\phi_3^2)1.86 +$$
$$(\phi_2^1\phi_4^2 + \phi_2^2\phi_4^1 - \phi_2^1\phi_4^1 - \phi_2^2\phi_4^2)1.31 +$$
$$(\phi_2^1\phi_5^2 + \phi_2^2\phi_5^1 - \phi_2^1\phi_5^1 - \phi_2^2\phi_5^2)0.80 +$$
$$(\phi_2^1\phi_6^2 + \phi_2^2\phi_6^1 - \phi_2^1\phi_6^1 - \phi_2^2\phi_6^2)2.58 +$$
$$(\phi_2^1\phi_7^2 + \phi_2^2\phi_7^1 - \phi_2^1\phi_7^1 - \phi_2^2\phi_7^2)0.64 +$$
$$(\phi_3^1\phi_4^2 + \phi_3^2\phi_4^1 - \phi_3^1\phi_4^1 - \phi_3^2\phi_4^2)0.36 +$$
$$(\phi_3^1\phi_5^2 + \phi_3^2\phi_5^1 - \phi_3^1\phi_5^1 - \phi_3^2\phi_5^2)0.46 +$$
$$(\phi_3^1\phi_6^2 + \phi_3^2\phi_6^1 - \phi_3^1\phi_6^1 - \phi_3^2\phi_6^2)5.17 +$$
$$(\phi_3^1\phi_7^2 + \phi_3^2\phi_7^1 - \phi_3^1\phi_7^1 - \phi_3^2\phi_7^2)4.71 +$$
$$(\phi_4^1\phi_5^2 + \phi_4^2\phi_5^1 - \phi_4^1\phi_5^1 - \phi_4^2\phi_5^2) - 0.04 +$$
$$(\phi_4^1\phi_6^2 + \phi_4^2\phi_6^1 - \phi_4^1\phi_6^1 - \phi_4^2\phi_6^2)0.39 +$$
$$(\phi_4^1\phi_7^2 + \phi_4^2\phi_7^1 - \phi_4^1\phi_7^1 - \phi_4^2\phi_7^2)3.91 +$$
$$(\phi_5^1\phi_6^2 + \phi_5^2\phi_6^1 - \phi_5^1\phi_6^1 - \phi_5^2\phi_6^2)1.78 +$$
$$(\phi_5^1\phi_7^2 + \phi_5^2\phi_7^1 - \phi_5^1\phi_7^1 - \phi_5^2\phi_7^2)0.57 +$$
$$(\phi_6^1\phi_7^2 + \phi_6^2\phi_7^1 - \phi_6^1\phi_7^1 - \phi_6^2\phi_7^2)0.69 < 0.05$$

Where $$\phi_1^1 = \frac{4.96\, m_1}{\sum_i A_i m_i},\ \phi_2^1 = \frac{7.02\, m_2}{\sum_i A_i m_i},\ \phi_3^1 = \frac{8.84\, m_3}{\sum_i A_i m_i},$$

$$\phi_4^1 = \frac{4.60\, m_4}{\sum_i A_i m_i},\ \phi_5^1 = \frac{6.02\, m_5}{\sum_i A_i m_i},\ \phi_6^1 = \frac{7.06\, m_6}{\sum_i A_i m_i}\ \text{and}$$

$$\phi_7^1 = \frac{7.01\, m_7}{\sum_i A_i m_i},\ \text{and}$$

where $$\phi_1^2 = \frac{4.96\, n_1}{\Sigma A_i n_i},\ \phi_2^2 = \frac{7.02\, n_2}{\Sigma A_i n_i},\ \phi_3^2 = \frac{8.84\, n_3}{\Sigma A_i n_i},$$

$$\phi_4^2 = \frac{4.60\, n_4}{\Sigma A_i n_i},\ \phi_5^2 = \frac{6.02\, n_5}{\Sigma A_i n_i},\ \phi_6^2 = \frac{7.06\, n_6}{\Sigma A_i n_i}\ \text{and}$$

$$\phi_7^2 = \frac{7.01\, n_7}{\Sigma A_i n_i},\ \text{and}$$

where $$\sum_i A_i n_i = 4.96\, n_1 + 7.02\, n_2 + 8.84\, n_3 + 4.60\, n_4 + 6.02\, n_5 +$$

$$7.06\, n_6 + 7.01\, n_7$$

with the proviso that $\phi_2^1\ \phi_4^1\ \phi_3^2$ and $\phi_6^2$ are not equal to 0, and where $m_1$ is the molar fraction of 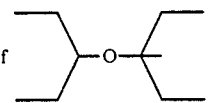 radicals in the poly(aryl sulfone);

$m_2$ is the molar fraction of 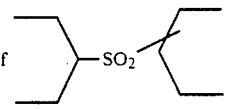 radicals in the poly(aryl sulfone);

$m_3$ is the molar fraction of 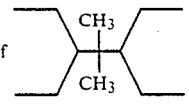 radicals in the poly(aryl sulfone);

$m_4$ is the molar fraction of 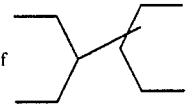 radicals in the poly(aryl sulfone);

$m_5$ is the molar fraction of 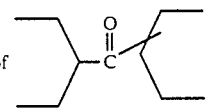 radicals in the poly(aryl sulfone);

$m_6$ is the molar fraction of 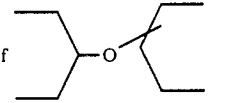 radicals in the poly(aryl sulfone);

$m_7$ is the molar fraction of 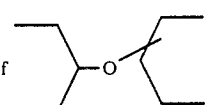 radicals in the poly(aryl sulfone);

$n_1$ is the molar fraction of 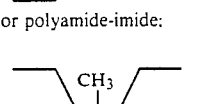 radicals in the polyimide or polyamide-imide;

$n_2$ is the molar fraction of 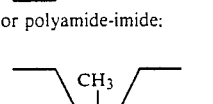 radicals in the polyimide or polyamide-imide;

$n_3$ is the molar fraction of 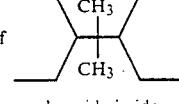 radicals in the polyimide or polyamide-imide;

$n_4$ is the molar fraction of 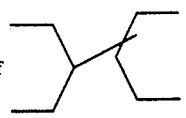 radicals in the polyimide or polyamide-imide;
$n_5$ is the molar fraction of 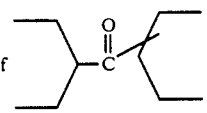 radicals in the polyimide or polyamide-imide;
$n_6$ is the molar fraction of 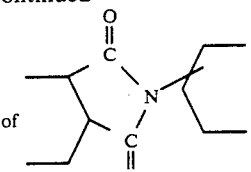 radicals in the polyimide or polyamide-imide;
$n_7$ is the molar fraction of 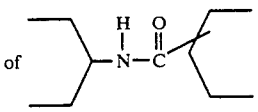 radicals in the polyimide or polyamide-imide.
* * * * *

UNITED STATES PATENT AND TRADEMARK OFFICE
CERTIFICATE OF CORRECTION

PATENT NO. : 5,037,902

DATED : August 6, 1991

INVENTOR(S) : Harris et al

It is certified that error appears in the above-identified patent and that said Letters Patent is hereby corrected as shown below:

In Claim 13, at Column 35, line 54, insert: -- Where $\Sigma A_i m_i = 4.96 m_1 + 7.02 m_2 + 8.84 m_3 + 4.60 m_4 + 6.02 m_5 + 7.06 m_6 + 7.01 m_7$, and --

Signed and Sealed this

Second Day of March, 1993

*Attest:*

STEPHEN G. KUNIN

*Attesting Officer*     *Acting Commissioner of Patents and Trademarks*